United States Patent [19]

Companion

[11] Patent Number: 5,051,870
[45] Date of Patent: Sep. 24, 1991

[54] ELECTRONIC SOCKET ATTACHMENT METHOD AND IDENTIFICATION SYSTEM

[76] Inventor: John A. Companion, 20 A Curtis La., Hampton, Va. 23669

[21] Appl. No.: 536,499

[22] Filed: Jun. 11, 1990

[51] Int. Cl.$^5$ .......................... H01R 9/00; H05K 3/30
[52] U.S. Cl. ..................................... 361/405; 29/837; 29/747; 156/63; 361/403; 439/491
[58] Field of Search .................... 283/81, 114; 156/69; 439/525, 526; 361/903; 29/837, 838, 839, 747

[56] References Cited

U.S. PATENT DOCUMENTS

| | | | |
|---|---|---|---|
| 3,874,759 | 9/1975 | Colombo | 361/403 X |
| 3,989,338 | 11/1976 | Gosser | 439/491 X |
| 4,305,767 | 12/1981 | Corey | 156/63 X |
| 4,340,774 | 7/1982 | Nilsson et al. | 361/400 X |
| 4,373,655 | 2/1983 | McKenzie, Jr. | |
| 4,387,127 | 6/1983 | Ogden | |
| 4,578,136 | 3/1986 | Brown | |
| 4,609,208 | 9/1986 | Wrobel | |
| 4,617,708 | 10/1986 | Fanning | |
| 4,756,968 | 7/1988 | Ebe et al. | |

OTHER PUBLICATIONS

IBM Technical Disclosure Bulletin, vol. 27, No. 7A, Dec. 1984, p. 3964, by Lowery.
Metals and Controls, Inc., Preliminary Bulletin, 12/1965, DD-ICP-7, Texas Instruments, Inc. (Pin Pack Connectors).

Primary Examiner—Carl J. Arbes
Attorney, Agent, or Firm—Wallace J. Nelson

[57] ABSTRACT

An electronic socket attachment and identification system utilizes a first identification label on the top surface of an individual integrated circuit and a second identification label dimensioned to fit between the pins of the integrated circuit is adhered to the underside or bottom of the circuit board. The second identification label is a mirror image of the first label and each label is provided with color coding and numerical indicia thereon to identify the pin number, pin location, circuit orientation, etc. A socket sticker in the form of a double-backed adhesive tape is employed between the circuit socket and circuit board to secure the integrated circuit socket to the electronic circuit board. The individual top and bottom identification stickers, as well as the double-backed adhesive socket stickers, are packaged in color coded identifying dispensers and diespensed as a group from a common, releasable paper, carrier tape.

11 Claims, 3 Drawing Sheets

ELECTRONIC SOCKET ATTACHMENT METHOD AND IDENTIFICATION SYSTEM

FIELD OF THE INVENTION

This invention relates to electronic circuits in general and relates in particular to an integrated circuit attachment and identification system on a printed electronic circuit board.

BACKGROUND OF THE INVENTION

Vast numbers of prototype electronic circuit boards are assembled daily by industry, research operations and by the hobbyist. These boards utilize a very large number of integrated circuits and each may use one or more wire wrap, solder pin and insulation displacement sockets. Integrated circuits normally employed are provided with dual-in-line leads and are normally referred to as "DIPs". In each application, the work of the assembler, and later on the debugger, or repairman, could be simplified if a reliable, simple system for quickly identifying each pin and each circuit being used were available.

At present, only the wire wrap socket systems have an identification system and these have the disadvantages of not holding the circuit socket in place, they do not identify both faces of the circuit and they are expensive to use. In some applications, individual wires of a circuit are tagged by employing wrap around tags having numerical indicia thereon to the individual pins of an integrated circuit. This is a time consuming and tedious task. Perforated rigid plastic tags, having identifying indicia thereon, are available and are adapted to be forced over and retained by the sharp pins of an individual integrated socket. These tags will fit only the wire wrap sockets and there is always a tendency to prick the fingers when pushing the plastic tags over the sharp circuit pins. Also, if soldering of the joint is necessary, the plastic tags tend to melt and become unreadable while also contaminating the joint. Cut and glued paper labels, with freehand written data thereon, have also been employed for the top of integrated circuits and for the circuit boards but these are time consuming and inconvenient to use, as well as having a tendency to be destroyed if soldering is required.

Presently, most integrated circuit sockets, as used in prototyping or limited production PC boards, are attached to the circuit boards by use of glue, room temperature vulcanized (RTV) rubber cement, or the like. This is a slow, time consuming, and messy operation with the adhesive having a tendency to be forced through the pin holes in the circuit board and possibly interfering with the integrity of the electrical connection.

Accordingly, there is a definite need in the art for an improved system for attaching integrated circuits to an electronic circuit board and to provide visual identification of the integrated circuits employed.

It is therefore an object of the present invention to provide positive, attachment structure for releasably securing integrated circuits to an electronic circuit board.

Another object of the present invention is a sticker system to give visual indication of the individual pin number and location on an integrated circuit when attached to an electronic circuit board.

A further object of the present invention is an identification sticker adapted to be placed on the bottom of an electronic circuit board to give visual indication of the pin number, location and circuit orientation of an integrated circuit attached thereto.

An additional object of the present invention is an identification sticker system including an identifying top sticker for an integrated circuit and a bottom sticker for attachment to the circuit board beneath the integrated circuit connected thereto.

A further object of the present invention is to provide color coded and numerical indicia, mirror image, labels for identifying an integrated circuit from the top and from the bottom when the integrated circuit is secured to an electronic circuit board.

A still further object of the present invention is a novel color-coded dispenser for stowing and dispensing a plurality of identifying and attachment circuit stickers.

SUMMARY OF THE INVENTION

According to the present invention the foregoing and additional objects are attained by providing a first identification label having an adhesive backing thereon and of substantially the same length and width dimensions as that of the top surface of an individual integrated circuit, a second identification label dimensioned to fit between the pins of the integrated circuit and adhered to the underside or bottom of the circuit board and a socket sticker in the form of a double-backed tape, of the appropriate thickness and, adapted to adhere to the socket receiving the integrated circuit and the top of the electronic circuit board to secure the integrated circuit socket to the electronic circuit board.

BRIEF DESCRIPTION OF THE DRAWING

A more complete appreciation of the invention and many of the attendant advantages thereof will be more readily apparent as the same becomes better understood in reference to the accompanying drawings wherein.

DETAILED DESCRIPTION

Figure 1:
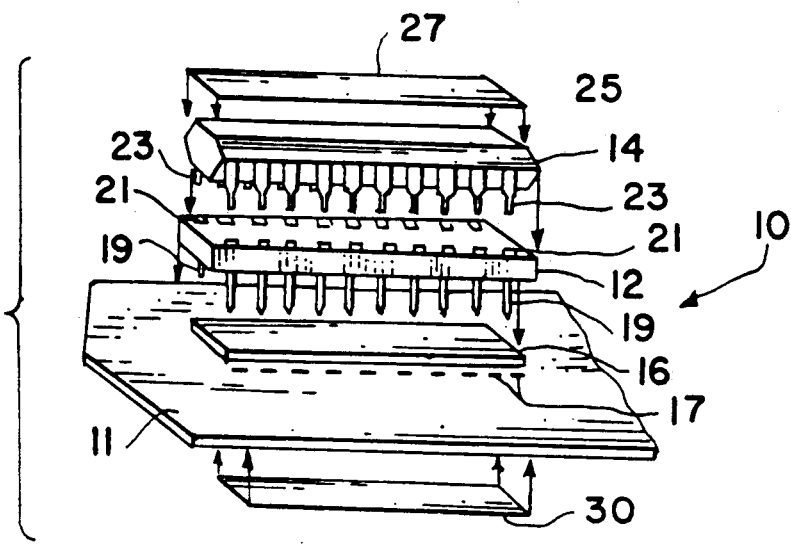
FIG. 1 is an exploded view of an integrated circuit, socket and printed circuit board employing the identification and attachment system of the present invention.

Referring now to the drawings and more particularly to FIG. 1, a portion of an electronic circuit board assembly employing the integrated socket identifying and securing system of the present invention is shown and designated generally by reference numeral 10. As shown therein, assembly 10 includes a printed electronic circuit board 11 with an electronic socket 12 and an integrated circuit 14 adapted to be secured thereto. Electronic socket 12 is secured to electronic circuit board 11 by a strip of double backed foam adhesive tape 16 positioned between two rows of holes 17 (one not visible in FIG. 1) formed in circuit board 11. The holes in each row 17 are equal to and spaced to receive the individual contact pins 19 extending from the bottom surface of electronic circuit socket 12. The double backed foam adhesive tape strip 16 has a length substantially equal to the length of socket 12 and a width substantially equal to the spacing between the two rows of contact pins 19 on socket 12. As conventional, two rows of openings or sockets, as designated by reference numeral 21, are formed on the top surface of socket 12 and serve to receive contact pins 23 of integrated circuit 14. Pins 23 are received within, and individually electrically connect with, contact pins 19 of socket 12.

An identification label or sticker 27, formed of pressure sensitive adhesive backed, heat resistant, paper or similar material, is adapted to be adhesively attached to the top of integrated circuit or module 14. Sticker 27 is provided with color coded and numerical indicia to give visual indication of the number and placement of each contact pin provided on integrated circuit module 14. Also, suitable indicia on sticker 27 indicates the orientation of the integrated circuit 14 and suitable space is also provided for adding an identification number, if desired. Identification label or sticker 27 has length and width dimensions substantially equal to the top dimensions of integrated circuit module 14.

A bottom identification label or sticker 30, also formed of heat resistant paper or similar material, is provided with a pressure sensitive adhesive backing and is adapted to be attached to the bottom of printed circuit board 11. Sticker 30 has a length substantially equal to the length of circuit module 14 and a width essentially equal to the width between the two rows of holes 17 in circuit board 11. The indicia on bottom sticker 30 is substantially a mirror image of that on top sticker 27 to provide "at a glance" information regarding the number and location of individual contact pins leading from circuit module 25, circuit module orientation, and circuit identification number, when used.

Figure 2:
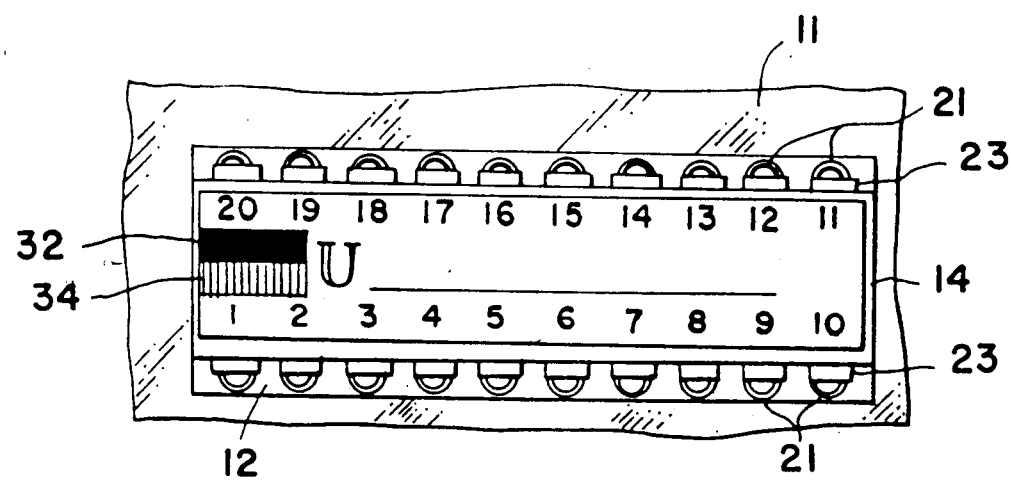
FIG. 2 is a top plan view of the attached components shown in FIG. 1 and illustrating the exposed view of the top identification label, or sticker, of the present invention.
Figure 3:
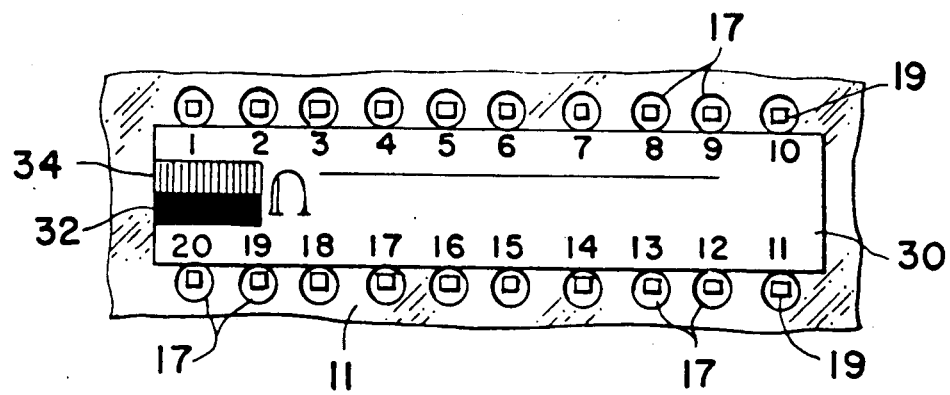
FIG. 3 is a bottom plan view of the attached components shown in FIG. 1 and illustrating the exposed view of the identification label, or sticker, employed on the underside of the circuit board.

Referring now more particularly to FIGS. 2 and 3, the details of a specific top label or sticker 27 and a bottom label or sticker 30 will now be described. As shown therein, the illustrated integrated circuit 14 is provided with two spaced rows of contact pins 23 with ten pins in each row. Pins 23 are individually received in sockets 21 formed in electronic socket unit 12. Electronic socket unit 12 is attached to electronic circuit board 11 as described hereinbefore. A pair of parallel color coded bars 32, 34 give instant visual indication of the number, as well as the orientation, of contact pins on integrated circuit module 14. In this illustrated embodiment twenty pins, disposed in two parallel rows 23, are employed.

An exemplary and standard electronic color code chart, immediately recognizable by those likely to be using the present invention, and that employed for the color bars in the specific embodiments described herein, is as follows:

Black=zero; Brown=one; Red=two; Orange=three; Yellow=four; Green=five; Blue=six;

Violet=seven; Gray=eight; and, White=nine.

"Dip" integrated circuits normally have 8-40 contact pins disposed in two symmetrical rows and the above color chart is adequate to provide "at a glance" indication of the number of pins, as well as the orientation of the chip, on an individual circuit. The color bar nearest to the number "1" on the label is the first number to be read. Thus, color bar 34, as shown in FIGS. 2 and 3, is red, while color bar 32 is black, to denote that top sticker 27 and bottom sticker 30 are for a twenty-pin circuit. The color bars are always located at the end adjacent to pin "1" of the integrated circuit.

The bottom sticker 30 is attached to the underside of circuit board 11 and is a substantially mirror image of top sticker 27. As shown, contact pins 19 of socket 12 extend through the two rows of holes 17 provided in circuit board 11. The "U" and the blank line (not designated) on each of stickers 27 and 30 give the orientation of circuit 14 while also providing space for adding an identification serial number for the circuit, if so desired.

Figure 4:
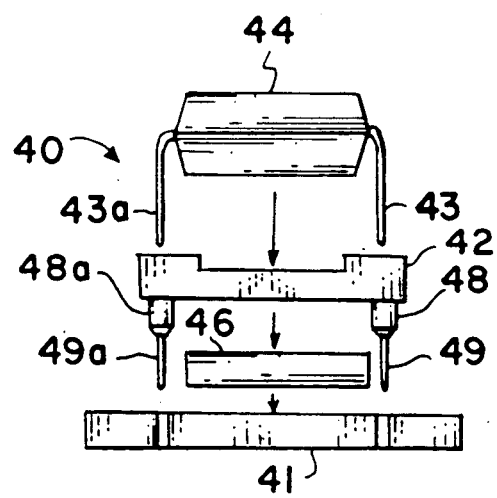
FIG. 4 is an exploded, part schematic, end view of assembled similar components, as that shown in FIG. 1, and illustrating the double backed adhesive foam tape sticker system employed with a shoulder-type integrated circuit socket.
Figure 5:
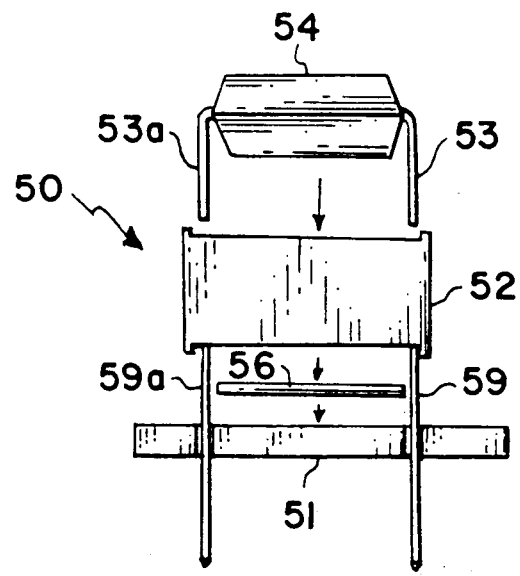
FIG. 5 is an exploded, part schematic, end view similar to FIG. 4 and illustrating the relatively thin, foam or paper tape having a double backed adhesive coating to serve as a connecting sticker employed with a flush type socket.

Referring to FIGS. 4 and 5, part schematic, exploded end views of two types or modifications of circuits employing the double backed adhesive tape, for attaching an integrated circuit socket to a printed electronic circuit board, are illustrated. In FIG. 4, an exploded view of the integrated circuit, socket and circuit board assembly is shown and designated generally by reference numeral 40. Assembly 40 includes printed circuit board 41, a shoulder type socket 42, and an integrated circuit 44. Integrated circuit 44 electrically connects with socket 42 via two rows of contact pins, with only one end member of each row being shown in this FIG. and designated, respectively, by reference numerals 43, 43a. Each individual contact pin 49, 49a in the two rows on socket 42 is provided with a shoulder spacer 48, 48a to maintain socket 42 spaced from circuit board 41. A double backed adhesive strip of foam tape 46 is positioned between the rows of shoulder spacers 48, 48a and serves to secure socket 42 to circuit board 41. Foam tape 46 has a thickness slightly greater than the length of shoulders spacers 48, 48a to ensure tape contact with both circuit board 41 and socket 42. Foam tape 46 has a length substantially equal to the length of integrated circuit 44 and a width substantially equal to, or slightly less than, the width between the two rows of spacers 48, 48a.

Referring now specifically to FIG. 5, the exploded view of the assembly, generally designated by reference numeral 50, includes a printed circuit board 51, a flush type socket 52 and an integrated circuit 54. Integrated circuit 54 is provided with two rows of contact pins, with only the end members thereof being shown, and designated, respectively, by reference numerals 53, 53a. Contact pins 53, 53a are received by socket 52 and electrically connect with two rows of equal number contact pins 59, 59a thereon. Again, only the end members of the two rows of contact pins 59, 59a are illustrated in the interest of clarity. Since contact pins 59, 59a do not have the shoulder type spacers, a relatively thin double backed adhesive tape 56 provides adequate contact between the parts to firmly secure socket 52 in position on printed circuit board 51. Double backed adhesive tape 56 is formed of suitable heat resistant paper in the preferred embodiment, but may also be formed of any other suitable material, if so desired. As in the embodiment of FIG. 4, double backed adhesive tape 56 is dimensioned to have a length substantially equal to the length of the flush type socket 52 and a width substantially equal to, or slightly less than, the spacing provided between the two rows of contact pins 49.

Figure 6:
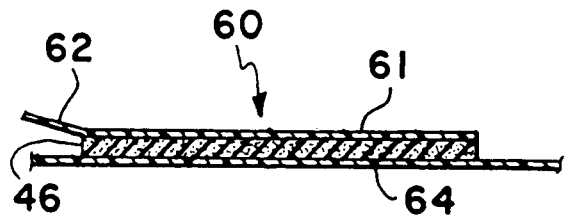
FIG. 6 is a sectional view of the double-backed adhesive foam tape employed to attach the socket shown in FIG. 4.

Referring now to FIG. 6, a sectional view of a relative thick double backed adhesive foam tape strip and the protective covering therefor is shown and designated generally by reference numeral 60. The protective covered tape 60 includes a double backed foam tape strip 46 and is illustrated as it appears prior to being employed in the embodiment of FIG. 4 to attach the shoulder type socket 42 to printed circuit board 41. As shown therein, tape 46 is provided with a top releasable paper cover 61 with a continuation thereof beyond the length of tape 46 serving as a pull tab 62 to assist in exposing the top adhesive surface of foam tape 46. The bottom of foam tape 46 is provided with a protective paper carrier 64. Carrier 64 is a continuous paper strip covering the bottom of multiple, adhesive surfaced tapes 46, as will be further explained hereinafter.

Figure 7:
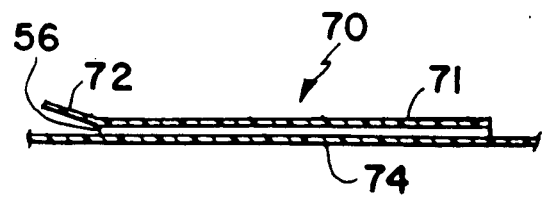
FIG. 7 is a sectional view of the double-backed adhesive paper tape employed to attach the socket shown in FIG. 5.

Referring now to FIG. 7, a sectional view of a relatively thin double backed adhesive tape strip and protective covering therefor is shown, and designated generally by reference numeral 70. Protective covered tape 70 includes a double backed paper tape strip 56 and is shown as it appears prior to being employed in the embodiment of FIG. 5 to secure a flush type socket 52 to printed circuit board 51. As shown therein, tape 56 is provided with a top releasable paper covering 71. A continuation of covering 71 extends beyond the length of tape 56 and serves as a pull tab 72 to assist in removing cover 71 to expose the top adhesive surface of tape 56. The bottom adhesive surface of tape 56 is protected by a continuous paper strip carrier 74, containing a number of like covered tape units, as will also be further explained hereinafter.

Figure 8:
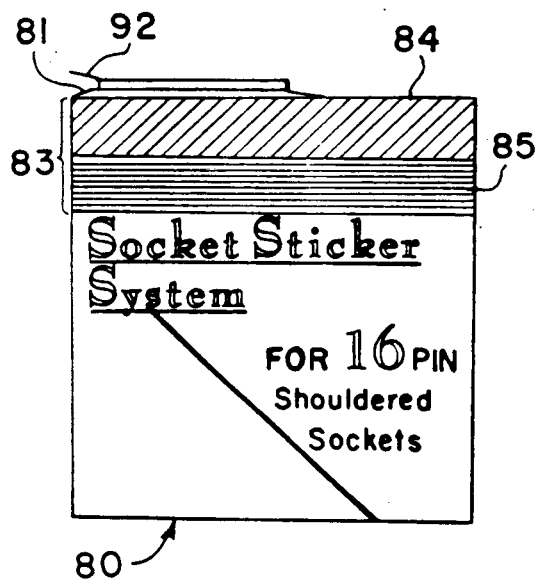
FIG. 8 is an illustration of one color coded dispenser for the socket stickers employed in the present invention.

Referring now to FIG. 8, a color-coded box dispenser for stowing and dispensing multiple labels or stickers is shown and designated generally by reference numeral 80. Dispenser 80 is color coded to indicate the type and pin number for the particular labels or stickers contained therein. The color pattern on the exterior of dispenser 80 is divided into three distinct areas. Approximately one-third of the side area of dispenser box 80, adjacent the top thereof and, designated by reference numeral 83, is further divided into two equal sections 84, 85 that serve as color code bars to identify number of pins in the integrated circuit for which the enclosed stickers are designed. In the illustrated embodiment, top section 84 is brown and section 85 is blue to give color indication that box 80 contains labeling socket stickers for a 16-pin integrated circuit.

Figure 9:
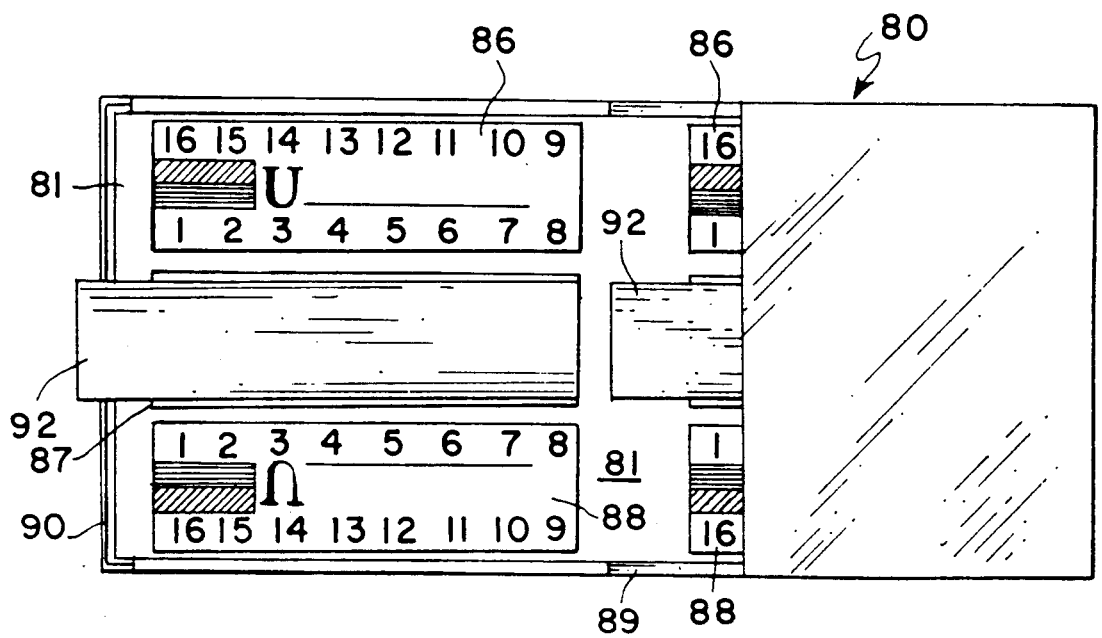
FIG. 9 is an enlarged top view of the color coded dispenser shown in FIG. 8.

Referring now more particularly to FIG. 9, dispenser box 80 contains the three components of the socket sticker system arranged in parallel rows and disposed on, and attached via a coating of pressure sensitive adhesive to, a common, releasable paper, tape carrier 81. In the illustrated embodiment, looking at the top of box 80, top identification stickers 86 are disposed on the right, socket stickers 87 are in the middle, and bottom identification stickers 88 are on the left. This arrangement places the stickers in logical groupings as they would likely be used. The thickness of socket sticker 87 then determines the base, or bottom two-thirds area, color of box 80. For example, a pale green color is used for the stickers intended for shouldered sockets 42, illustrated in FIG. 4, and tan for the stickers intended for the flush mounted, or "production", sockets as designated by reference numeral 52 in the illustration of FIG. 5. Since the stickers presently need to be available in two different widths, two different width boxes 80, are available. Additional identification indicia, to identify the contents, may or may not be added to box 80.

Figure 10:
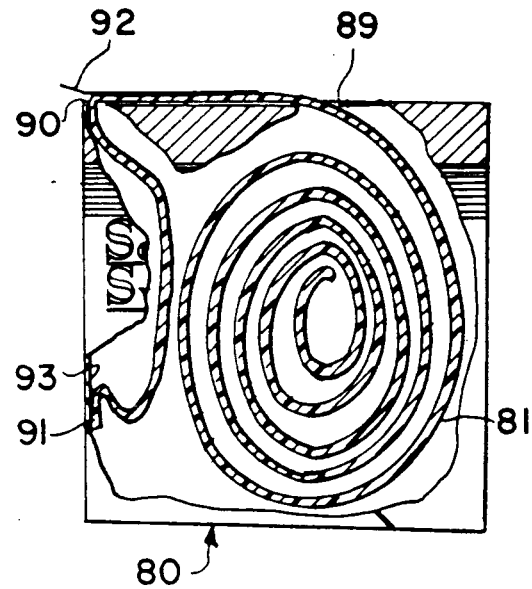
FIG. 10 is another view of the dispenser shown in FIG. 8 with parts broken away and parts schematically shown.

Referring now more particularly to FIG. 10, the details of dispenser box 80 will now be described. As schematically shown, carrier tape 81 is disposed in a coil within box 80 and emerges from the top thereof through a slot 89. Slot 89 is located at, or sufficiently close to an edge of box 80, to completely expose to view at least one grouping of top sticker 86, socket sticker 87 and bottom sticker 88, when looking at the top of box 80 (FIG. 9). Thus, as box 80 is picked up, the stickers are visible and readily accessible. This visual display of the box contents eliminates the necessity of providing a picture or other identification on the box since the real thing may be seen at a glance. Paper carrier strip 81 re-enters box 80 through a narrow slot 90 disposed at the opposite edge of box 80 from that of emerging slot 89. One end 91 of carrier strip 81 is adhesively, or otherwise conventionally attached to the inner surface 93 of box 80, as illustrated. This attachment ensures that, as the paper carrier strip 81 is pushed along the top surface of box 80, by the user's thumb or forefinger, the carrier strip 81 will pass into the take-up slot 90. The mechanical action of carrier strip 81 turning the corner on box 80 to re-enter box 80, frees the ends of stickers 86, 87 and 88 from the carrier strip 81 to thereby make removal of the stickers easy and convenient.

The other or free end 95 of carrier strip 81 is initially positioned within a coil 96 of carrier strip 81 within box 80. After the supply of stickers 86, 87 and 88 are exhausted on carrier strip 81, the entire length thereof will have been threaded back into box 80 through slot 90. Top stickers 86 and bottom stickers 88 are attached to the integrated circuit as removed from carrier strip 81. Socket stickers 87 still have a cover strip 92 on one side thereof that is provided with an extension or overlap portion to assist in grasping and positioning of socket sticker 87 without having to come in contact with an adhesive surface thereon. Once one side of socket sticker 87 is placed in position, cover strip 92 is removed to expose the other adhesive surface thereon. In the illustrated embodiments of FIGS. 4 and 5, socket stickers 46 and 56 have both adhesive sides exposed.

Since carrier strip 81 goes back into, and is retained within, box 80, the used portion of the carrier strip does not have to be torn off or otherwise disposed of. Box 80 is designed to permit refilling after the supply of stickers contained therein is exhausted. This refilling may be accomplished by removing the old carrier tape 81, and inserting and attaching a completely new carrier strip 81 with stickers attached thereto.

Although the invention has been described relative to specific embodiments thereof, it is not so limited and there are obviously many variations and modifications of the invention that will be readily apparent to those skilled in the art in the light of the above teachings.

For example, the conventional specific colors employed in the color coded system described herein are intended to be exemplary and are not mandatory. Other color selections and positioning thereof relative to the component parts may be utilized without departing from the spirit and scope of the invention. Also, dispenser box 80 is not confined to use as a dispenser for circuit identification and attachment stickers, as employed herein, but may be used to dispense any type of stickers desired.

In the specific examples described herein, heat resistant paper was employed for the specific identification stickers but equivalent materials may be used and any material suitable for the purposes intended is deemed within the scope of the invention, it being understood that the indicia and the material employed must remain heat stable during soldering or other short term exposure to high temperatures intended for use with the circuit board.

It is therefore to be understood that, within the scope of the appended claims, the invention may be practiced other than as specifically described herein.

What is claimed as new and desired to be secured by Letters Patent of the United States is:

1. An identification label system for a combination integrated circuit, integrated circuit socket and a prototype circuit board comprising:
   an adhesively backed top sticker having a length and width substantially equal to that of the top surface of a multi-pin integrated circuit;
   said top sticker being provided with numerical indicia thereon equal in number to and spaced at intervals to correspond to the number of contact pins leading from the integrated circuit;
   color coded indicia on said adhesively backed top sticker to indicate at a glance the number of contact pins provided in the integrated circuit;
   an integrated circuit socket having a top surface and a bottom surface and including a number of open sockets on said top surface for receiving the contact pins of said integrated circuit and leading to an equal number of depending contact pins on said bottom surface and in electrical connection with said open sockets;
   a prototype circuit board receiving said contact pins of said integrated circuit socket therethrough;
   a second adhesively backed sticker having a length and width substantially equal to that of the spacing between said contact pins extending from said integrated circuit socket;
   said second sticker being provided with numerical indicia thereon arranged in mirror image position relative to that of the indicia on said top sticker and secured to said circuit board between the pins of said integrated circuit socket extending through said circuit board; and
   a circuit sticker means formed of a doubled backed adhesive tape securing said integrated circuit socket and said integrated electronic circuit to said circuit board.

2. An identification label system for an integrated circuit comprising:
   an adhesively backed top sticker having a length and width substantially equal to that of the top surface of a multi-pin integrated circuit;
   said top sticker being provided with numerical indicia thereon equal in number to and spaced at intervals to correspond to the number of contact pins leading from the integrated circuit;
   color coded indicia on said adhesively backed top sticker to indicate at a glance the number of contact pins provided in the integrated circuit;
   a second adhesively backed sticker being provided with numerical indicia thereon equal in number to and spaced at intervals to correspond to the number of contact pins leading from the integrated circuit;
   said numerical indicia being arranged on said second sticker in mirror image position relative to that of the indicia on said top sticker;
   said second sticker also having color coded indicia thereon to indicate at a glance the number of contact pins provided in the integrated circuit;
   both said top and said second stickers being provided with additional indicia thereon giving visual indication of the integrated circuit orientation;
   an integrated circuit socket frictionally receiving said contact pins of said integrated circuit in electrical connection with an equal number of contact pins extending from said integrated circuit socket;
   a prototype circuit board receiving said contact pins of said integrated circuit socket therethrough,
   a circuit sticker means formed of a doubled backed adhesive tape securing said integrated circuit and said integrated circuit socket to said prototype circuit board; and
   said second sticker being secured to said prototype circuit board and disposed between the pins of said integrated circuit socket extending through said prototype circuit board.

3. A method of locating and identifying individual integrated circuits and their pins and for securing the attachment sockets therefor to an electronic circuit board, comprising:
   providing a printed circuit board having a plurality of spaced openings therein to receive the contact pins from one or more integrated circuit sockets,
   providing at least one integrated circuit socket unit having a number of open sockets on the top surface thereof and an equal number of depending contact pins in electrical connection with the open sockets and depending from the bottom surface of the integrated circuit socket unit,
   providing a double backed adhesive tape strip and securing one side thereof to the bottom surface of the at least one integrated circuit socket unit and between the depending pins thereon,
   positioning the at least one integrated circuit socket unit onto the printed circuit board with the depending contact pins of the socket unit extending through the printed circuit board,
   adhesively bonding the other surface of the double backed adhesive tape strip to the top of the printed circuit board to thereby bond the integrated circuit socket unit to the printed circuit board,
   providing an integrated electronic circuit having a substantially flat top surface and a number of depending contact pins extending from the bottom surface thereof equal in number to and spaced to connect with the open sockets provided in the top surface of the at least one integrated circuit socket unit,
   inserting the depending contact pins from the integrated electronic circuit into the open sockets of the integrated circuit socket unit to provide electrical contact therebetween, providing a top identification label having substantially the same length and width dimensions as the top surface of each integrated circuit, the top identifying label having numerical and color coded indicia on one surface thereof to identify the number of depending contact pins extending from the bottom of the integrated circuit and having an adhesive backing on the other surface thereof, adhesively securing the adhesively backed top identification label to the substantially flat top surface of the integrated circuit, providing, and adhesively applying, a substantially mirror image of the top identification label to the underside of the printed circuit board between the depending contact pins extending from the integrated circuit socket and through the printed circuit board to thereby provide visual indication of the number of contact pins on the integrated circuit positioned on the printed circuit board.

4. The method of claim 3 wherein the numerical indicia on the top and mirror image identification labels give a visual indication on the individual contact pin locations and the orientation of the integrated circuit.

5. A method of identifying and attaching electronic circuits to a printed circuit board comprising the steps of:

providing a printed circuit board adapted to receive one or more electronic circuit sockets, providing an electronic socket unit having a plurality of open sockets along a top surface thereof and in individual electrical connection with an equal number of depending contact pins, the open sockets and depending contact pins being arranged in a pair of spaced rows, inserting the electronic socket depending pins through mating openings provided in the printed circuit board, employing a double backed adhesive tape strip to attach the electronic socket unit to the printed circuit board, providing an integrated electronic circuit module having a top surface and a bottom surface, with a plurality of contact pins depending from the bottom surface and arranged in a pair of straight spaced rows and equal in number to the open sockets in the electronic socket unit, inserting the integrated circuit depending contact pins into the open sockets of the electronic socket unit, providing a top identifying label having a pressure sensitive adhesive backing, of essentially the same length and width dimensions as that of the top surface of the integrated circuit module and having color coded and visual indicia thereon giving visual indication of the number of contact pins and orientation of the circuit on the printed circuit board, and adhesively securing the top identifying label to the top surface of the integrated circuit.

6. The method of claim 5 wherein said electronic socket unit is a shoulder type integrated circuit socket having individual spacer units disposed on each said depending contact pin to maintain said circuit socket unit spaced from said printed circuit board and said double backed adhesive tape strip is a foam strip having a thickness at least equal to the height of said spacer units to ensure contact of said double backed adhesive tape strip with both said integrated circuit socket unit and said printed circuit board.

7. The method of claim 5 wherein said electronic socket unit is a flush type integrated circuit socket and said double backed adhesive tape strip is a relatively thin, double backed adhesive tape formed of a material selected from the tape materials consisting of foam and paper.

8. The method of claim 5 wherein the top identifying label also contains numerical indicia indicating the location of the individual contact pins on the electronic circuit module.

9. The method of claim 8 including the steps of providing a bottom identifying label having a length and width substantially equal to the spacing between the pair of rows of depending contact pins extending from the electronic socket through the circuit board, and adhesively attaching the bottom identifying label to the underside of the printed circuit board between the pair of rows of the depending contact pins.

10. The method of claim 9 wherein the bottom identifying label is substantially a mirror image of the top identifying label and is also provided with a pressure sensitive adhesive backing.

11. The method of claim 10 wherein the double backed adhesive tape strip attaching the electronic socket unit to the printed circuit board, the top identifying label secured to the top surface of the integrated circuit and the bottom identifying label adhesively applied to the underside of the printed circuit board are provided and dispensed from a common box dispenser and disposed on a common carrier strip prior to attachment to the integrated electronic circuit and the printed circuit board.

* * * * *